(12) United States Patent
Philipp

(10) Patent No.: US 7,898,847 B2
(45) Date of Patent: Mar. 1, 2011

(54) METHOD TO PREVENT OVERRESET

(75) Inventor: Jan Boris Philipp, Peekskill, NY (US)

(73) Assignee: Qimonda AG, Neubiberg (DE)

( * ) Notice: Subject to any disclaimer, the term of this patent is extended or adjusted under 35 U.S.C. 154(b) by 751 days.

(21) Appl. No.: 11/715,749

(22) Filed: Mar. 8, 2007

(65) Prior Publication Data

US 2008/0219040 A1 Sep. 11, 2008

(51) Int. Cl.
*G11C 11/00* (2006.01)

(52) U.S. Cl. .............. 365/163; 365/148; 365/189.16; 365/189.14

(58) Field of Classification Search ............. 365/163, 365/148, 189.16, 189.09
See application file for complete search history.

(56) References Cited

U.S. PATENT DOCUMENTS

| 4,225,946 | A * | 9/1980 | Neale et al. ............ 365/163 |
| 6,813,177 | B2 * | 11/2004 | Lowrey et al. ......... 365/148 |
| 7,031,181 | B1 | 4/2006 | Happ |
| 2007/0008769 | A1 * | 1/2007 | Kim et al. ............. 365/148 |
| 2009/0080242 | A1 * | 3/2009 | Resta et al. ........... 365/163 |

* cited by examiner

*Primary Examiner* — Vu A Le
*Assistant Examiner* — Han Yang
(74) *Attorney, Agent, or Firm* — Eschweiler & Associates, LLC

(57) ABSTRACT

A method of addressing a memory cell includes applying a plurality of pulses to the memory cell, wherein a subsequent pulse has an amplitude greater than an initial pulse. In addition, a memory includes a memory cell and a control circuit configured to address the memory cell by applying a plurality of pulses to the memory cell, wherein a subsequent pulse has an amplitude greater than an initial pulse.

22 Claims, 6 Drawing Sheets

METHOD TO PREVENT OVERRESET

BACKGROUND OF THE INVENTION

In the case of conventional memory devices, in particular conventional semiconductor memory devices, it is sometimes common to differentiate between functional memory devices (e.g., PLAs, PALs, etc.) and table memory devices. For example, some table memory devices include ROM devices (Read Only Memory) such as PROMs, EPROMs, EEPROMs, flash memories, etc., and RAM devices (Random Access Memory or read-write memory) such as DRAMs and SRAMs.

In the case of SRAMs (Static Random Access Memory), individual memory cells typically comprise, for example, six transistors configured as a cross-coupled latch. In the case of DRAMs (Dynamic Random Access Memory), generally only one single, correspondingly controlled capacitive element (e.g., the gate-source capacitance of a MOSFET) is employed, wherein charge may be stored in the capacitance. The charge in a DRAM, however, remains for only a short time, and a periodic refresh must be performed, to maintain a data state. In contrast to the DRAM, the SRAM requires no refresh, and the data stored in the memory cell remains stored as long as an appropriate supply voltage is fed to the SRAM. Both SRAMs and DRAMs are considered volatile memories, wherein a data state is only retained as long as power is supplied thereto.

In contrast to volatile memory, non-volatile memory devices (NVMs), e.g., EPROMs, EEPROMs, and flash memories, exhibit a different property, wherein the stored data is retained even when the supply voltage associated therewith is switched off. This type of memory has several advantages for various types of mobile communications devices such as, for example, in an electronic rolodex on cell phones, wherein the data therein is retained even when the cell phone is turned off.

One type of non-volatile memory is called resistive or resistively switched memory devices. In such a resistive memory, a memory material positioned between two appropriate electrodes (i.e., an anode and a cathode) is placed, by appropriate switching processes, in a more or less conductive state, wherein the more conductive state corresponds, for example, to a logic "1", and the less conductive state corresponds, for example, to a logic "0" (or vice versa). Suitable resistive memories can be, for example, perovskite memory, as described in W. W. Zhuamg et al., "Novell Colossal Magnetoresistive Thin Film Nonvolatile Resistance Random Access Memory (RRAM)", IEDM 2002, resistive switching in binary oxides (OxRAM), for example, as described in I. G. Baek et.al., "Multi-layer crosspoint binary oxide resistive memory (OxRAM) for post-NAND storage application", IEDM 2005, phase change memory (PCRAM), and conductive bridging RAM (CBRAM), as described in M. Kund et al., "Conductive bridging RAM (CBRAM): An emerging non-volatile memory technology scalable to sub 20 nm", IEEE, 2005.

In the case of phase change memory, an appropriate chalcogenide compound (e.g., a GeSbTe or an AgInSbTe compound) may, for instance, be used as the active material that is positioned between the two corresponding electrodes. The chalcogenide compound material can be placed in an amorphous, i.e., relatively weakly conductive, or a crystalline, i.e., relatively strongly conductive state by means of appropriate switching processes, and thus behaves like a variable resistance element, which as highlighted above, may be exploited as differing data states.

In order to achieve a change in the phase change material from an amorphous state to a crystalline state, an appropriate heating current is applied to the electrodes, wherein the current heats the phase change material beyond the crystallization temperature thereof. This operation is sometimes called a SET operation. Similarly, a change of state from a crystalline state to an amorphous state is achieved by application of an appropriate heating current pulse, wherein the phase change material is heated beyond the melting temperature thereof, and the amorphous state is obtained during the rapid cooling process thereof. This operation is sometimes called a RESET operation. The combination of SET and RESET operations is one means by which data can be written to a phase change memory cell.

Conventionally, resistive switched memories such as phase change memory devices are organized in one or more arrays of phase change cells in a core area of the device, wherein each phase change memory cell is composed of a phase change memory element coupled to a selection switching device. One conventional arrangement is illustrated in FIG. 1, wherein a phase change element 10 is coupled between a bit line 12 and a bipolar select transistor 14. A word line 16 is coupled to the base terminal of the transistor 14. By properly addressing the bit line 12 and word line 16 associated therewith, data may be written thereto and read therefrom. An array of phase change memory cells configured in the manner described above is sometimes called a NOR type memory array.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In one embodiment of the invention, a method of addressing a memory cell is disclosed, and comprises applying a plurality of pulses to the memory cell, wherein a subsequent pulse has an amplitude greater than an initial pulse. In one embodiment of the invention, the pulses comprise current pulses, wherein each pulse has a voltage associated therewith that is less than an intrinsic switching voltage threshold of the memory cell.

In another embodiment of the invention, a memory is disclosed and comprises a memory cell and a control circuit. The control circuit is configured to address the memory cell by applying a plurality of pulses to the memory cell, wherein a subsequent pulse has an amplitude greater than an initial pulse. In one embodiment of the invention, the pulses comprise current pulses, wherein each pulse has a voltage associated therewith that is less than an intrinsic switching voltage threshold of the memory cell.

The various embodiments of the invention are applicable to both binary state phase change memory cells, as well as multi-level phase change memory cells. In addition, the various embodiments of the invention may be employed to directly heat the phase change material to effectuate a RESET, or alternatively may be applied to a heater structure that is thermally local to the phase change material to effectuate a RESET state, as may be desired.

The following description and annexed drawings set forth in detail certain illustrative aspects and implementations of

DETAILED DESCRIPTION OF THE INVENTION

Figure 1:
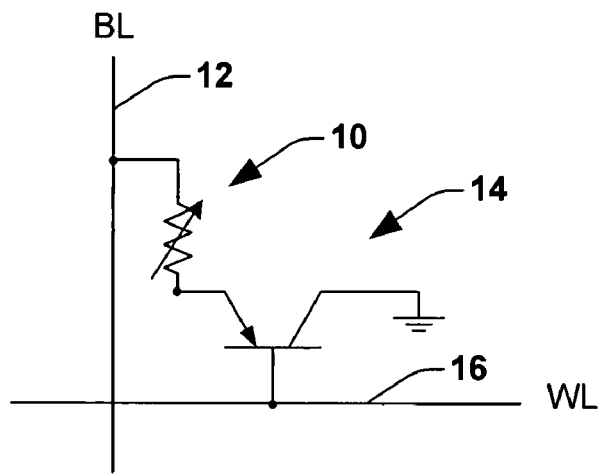
FIG. 1 is a schematic diagram illustrating a conventional memory architecture employing a select transistor for selective access to a memory element associated therewith.

One or more implementations of the present invention will now be described with reference to the attached drawings, wherein like reference numerals are used to refer to like elements throughout. The invention relates to a method and related memory circuit that prevents an overreset condition during an addressing of a memory cell.

Figure 2:
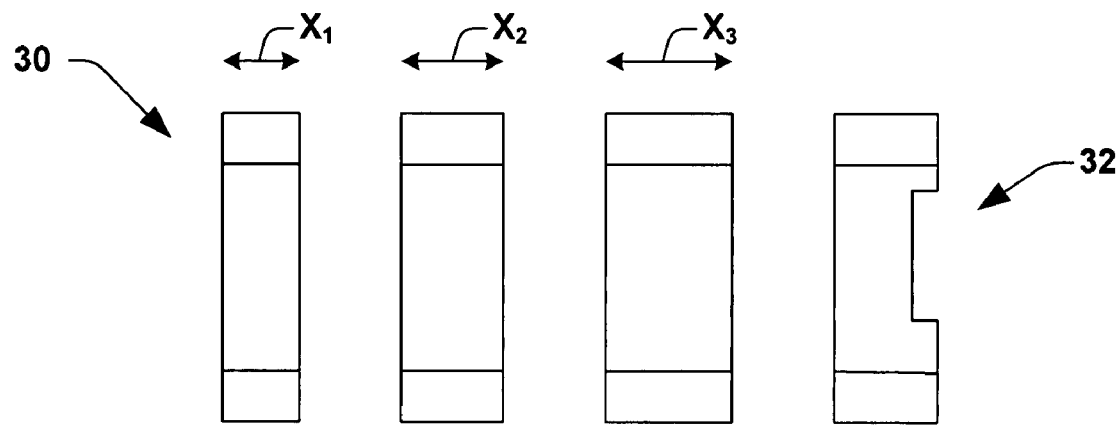
FIG. 2 is a plurality of phase change memory elements having different critical dimensions associated with variations in a manufacturing process.

As highlighted above, a phase change memory cell is switched between different states by performing a SET operation and a RESET operation, respectively. As illustrated in FIG. 2, when manufacturing a memory element such as a phase change memory element, the manufacturing process has a certain amount of variability, wherein a critical dimension (or CD) associated with a memory element 30 may vary between an acceptable minimum and maximum value. In FIG. 2, while $X_2$ may be the nominal critical dimension, variations in the manufacturing process may cause the critical dimension to vary between $X_1$ and $X_3$. Further, as shown at 32, sometimes a defect may occur in the manufacturing process that causes the memory element to be narrower than its intended critical dimension. When the critical dimension is at the low end (e.g., $X_1$ or due to a defect at 32), the current density associated with the RESET current pulse is substantially greater than would normally be present for a nominal or larger critical dimension, and the increased current density may cause a significant heating of the thermal environment of the memory cell. This is called an overreset, and this effect may cause a possible recrystallization of the memory cell and/or reduce the endurance of the memory cell due to the potential of increased diffusion. Further, an overreset can also reduce the amount of nucleation sites associated with the phase change material, and this condition can adversely affect the SET performance of the memory cell.

Figure 3:
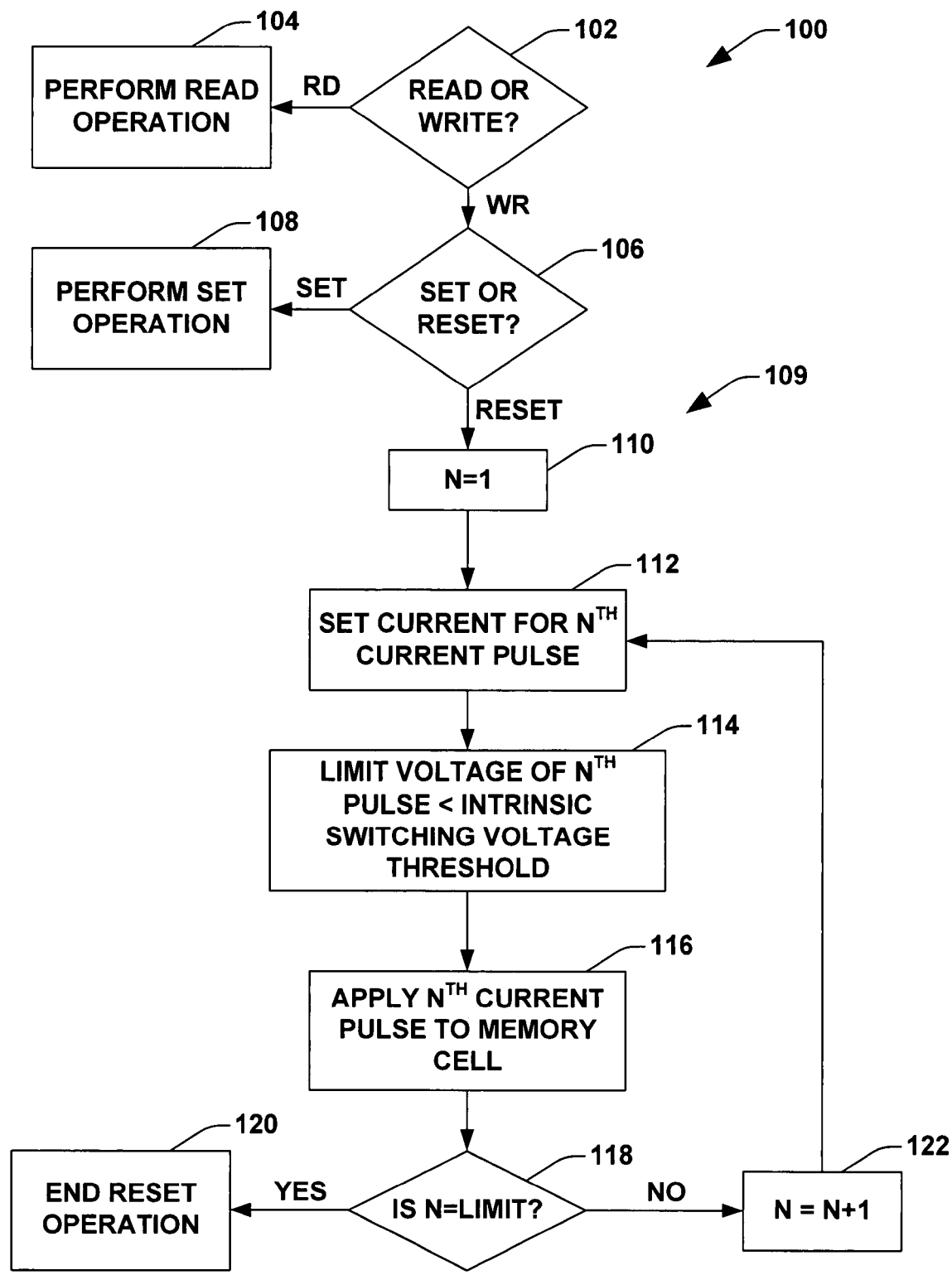
FIG. 3 is a flow chart diagram illustrating a method of addressing a memory cell according to one embodiment of the invention.

The present invention, according to one embodiment, is directed to a method of addressing a memory cell, wherein an overreset of the memory cell is avoided, thereby improving the performance associated therewith. Turning to FIG. 3, a method 100 of addressing a memory cell is provided. While the method 100 and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated actions may be required to implement a methodology in accordance with the invention.

The method 100 begins at 102 where a query is made whether a read or write operation is to be performed. If a read operation is to be performed, the method 100 proceeds to 104, where appropriate read access and addressing signals are provided to the selected memory cell. If a write operation is to be performed, however, the method 100 proceeds to 106, where another query is made whether a SET or RESET operation is to be performed on the selected cell. If a SET operation is to be performed, the method 100 proceeds to 108, where appropriate addressing is performed to the selected cell to effectuate a SET operation thereat. If a determination is made at 106 that a RESET operation is to be performed, the method 100 of the present invention proceeds generally to 109, wherein a method of performing a RESET operation that avoids an overreset condition for the selected cell is performed.

Initially, according to one embodiment of the invention, the method of performing a RESET operation 109 begins at 110 with the initialization of a count variable "n" to 1. The method 109 proceeds to 112, wherein the current magnitude of the $n^{th}$ pulse (in this case, the first pulse since n=1) is set. For example, in one embodiment of the invention, the current magnitude of successive pulses is different, for example, greater than an earlier pulse. For example, in one embodiment the first (e.g., n=1) current pulse magnitude is set at 100 microamps. Continuing on at 114, a voltage magnitude of the $n^{th}$ current pulse is limited. In one embodiment of the invention, the voltage magnitude of the current pulse is limited to be less than an intrinsic switching voltage threshold (Vth) of the memory cell. Consequently, as will be appreciated infra, if the first current pulse operates to effectively RESET the selected memory cell, then any subsequent current pulses that similarly are voltage limited will not operate to overreset the selected memory cell.

Figure 4:
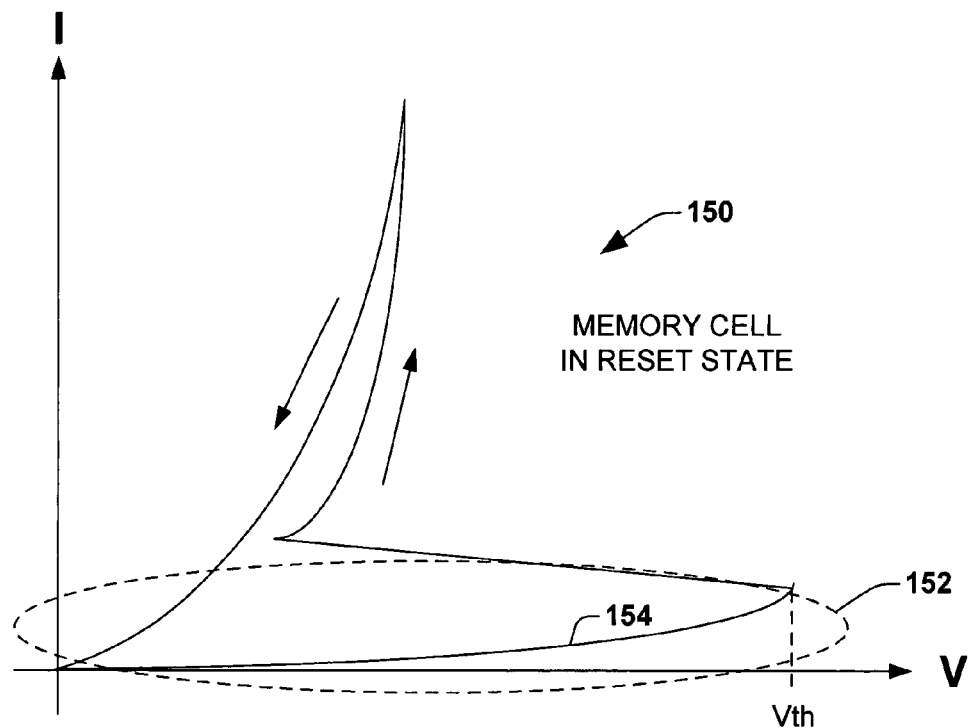
FIG. 4 is a graph illustrating an intrinsic switching voltage threshold characteristic of a phase change memory element that has been RESET.

A more detailed explanation of the voltage limitation follows in conjunction with FIG. 4. FIG. 4 is a graph 150 illustrating the behavior of a phase change memory cell that is already in the RESET state. As can be seen in the region 152, if the voltage across the phase change memory cell is less than a specific threshold (Vth), then the current that passes through the memory element is negligible, in that the current amount is not sufficient to alter the state of the cell. The threshold (Vth) in FIG. 4 is sometimes referred to as the intrinsic switching voltage threshold. When the voltage across the phase change memory cell increases above the threshold voltage, a snap-back behavior occurs, wherein the phase change element state as evidenced by its conductivity has changed, or at least been altered.

Figure 5:
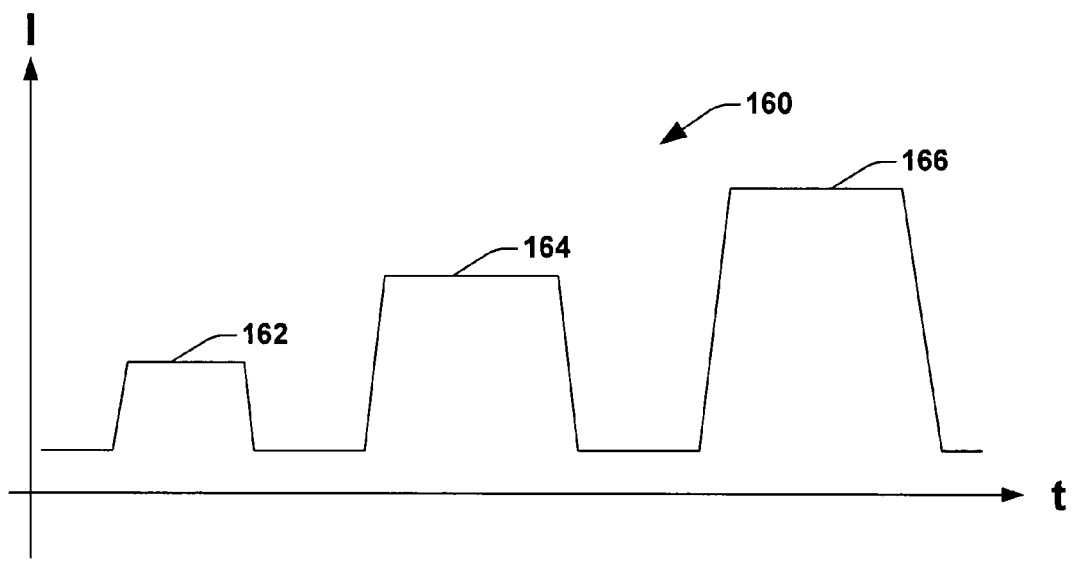
FIG. 5 is a graph illustrating a plurality of current pulses for use in addressing a memory element that prevents overreset according to one embodiment of the invention.

According to one embodiment of the present invention, a plurality of successively increasing current pulses are applied to the phase change memory cell during a RESET operation as illustrated in FIG. 5 at 160, wherein for each of the current pulses, the voltage magnitude associated therewith is less than the intrinsic switching voltage threshold (voltage of pulse not shown). Therefore if the first current pulse 162 happens to be sufficient to RESET the cell due to it having a relatively small critical dimension or defect associated therewith, the subsequent application of higher current pulses to the RESET cell (as will be appreciated infra) will not disturb the cell since the voltage associated with the current pulse is less than the threshold value.

Returning to FIG. 3, the $n^{th}$ current is applied to the phase change memory cell at 116. In one embodiment the RESET current pulse has the magnitude associated with the value "n", where for a first, or initial, pulse, the current value is at a minimum value that would be sufficient to RESET a memory cell at the lower end of the range of critical dimensions. That way, as discussed briefly above, if the critical dimension of the phase change memory element is relatively small due to manufacturing variations, the relatively small current pulse is sufficient to RESET the phase change memory cell without resulting in an overreset of the element that might otherwise occur if a standard, higher current magnitude current pulse was applied initially thereto.

The method 100 proceeds to 118, wherein a query is made whether the count variable "n" is equal to some predetermined limit value. According to one embodiment of the invention, the limit value is 3, wherein each phase change memory cell will thus be subjected to 3 successive current pulses during a RESET operation. Alternatively, however, the limit value may be selected to be another integer value, and all such alternatives are contemplated as falling within the scope of the present invention.

In the present example, "n" is still 1 (NO at 118), so the method 100 proceeds to 122, wherein the count variable "n" is incremented, and the current magnitude of the $n^{th}$ (a subsequent) current pulse is then set at 112. Since "n" is now 2, the current magnitude is set based on that count variable. As illustrated in FIG. 5, in one embodiment of the invention, the current magnitude for the second current pulse 164 is increased to a higher amount than the first pulse. In one embodiment of the invention, the second current pulse 164 is 150 microamps. Proceeding to 114 of FIG. 3, the voltage magnitude of the second current pulse 164 is again limited to a voltage value that is less than the intrinsic switching voltage threshold (Vth) of the selected phase change memory cell. As highlighted above, by limiting the voltage magnitude of the second reset pulse 164, if the phase change memory cell had been RESET with the first current pulse 162, the second pulse will not operate to adversely disturb the already established RESET state. If, however, the first current pulse 162 was not sufficient to RESET the phase change memory cell (e.g., due to the memory cell having a larger critical dimension), the second current pulse 164 exhibits an increased current magnitude that may be sufficient to trigger the RESET state when applied to the cell at 116.

Again, the count variable "n" is compared to the predetermined limit at 118. If the count is equal to the limit (YES at 118), the RESET operation is concluded at 120. If, however, the count variable "n" is not equal to the predetermined limit (NO at 118), the count variable is again incremented at 122 (e.g., n=3), and the current for the next RESET current pulse is set at 112. In one embodiment of the invention, as illustrated in FIG. 5, the third current pulse 166 has a current magnitude that is greater than the previous (second) current pulse 164 (e.g., 200 microamps). Further, as highlighted previously, the third current pulse 166 has a voltage magnitude that is limited at 114 to be less than the intrinsic switching voltage threshold (Vth) of the phase change memory cell at 114. The third current pulse 166 is then applied to the memory cell at 116.

If, for example, the critical dimension of the phase change memory cell was slightly larger than normal due to process variation, etc., the phase change memory cell may not have become RESET by either the first or second current pulses 162, 164. The third, largest current value current pulse 166 is designed to ensure that the phase change memory cell is properly RESET if the cell has not yet been RESET. Further, since the third current pulse 166 has a limited voltage magnitude associated therewith, if the cell had already been RESET by either the first or second pulses 162, 164, the third current pulse will not operate to disturb the memory cell.

The method 100 then proceeds to 118, wherein a query is again made whether the count variable is equal to the predetermined limit. In the above example, the limit is 3, so after the application of three current pulses, the answer to the query at 118 is YES, causing the RESET operation to be discontinued at 120.

As can be seen from the above example provided in FIG. 3, the method 100 of the present invention provides for a reliable RESET operation 109 of the phase change memory cell without the potential for an overreset condition and the adverse performance issues associated therewith.

Figure 7:
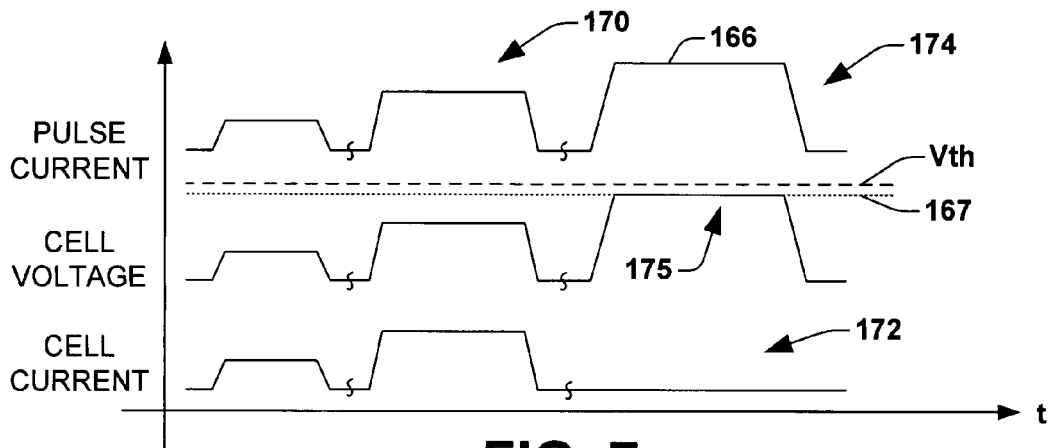
Figure 8:
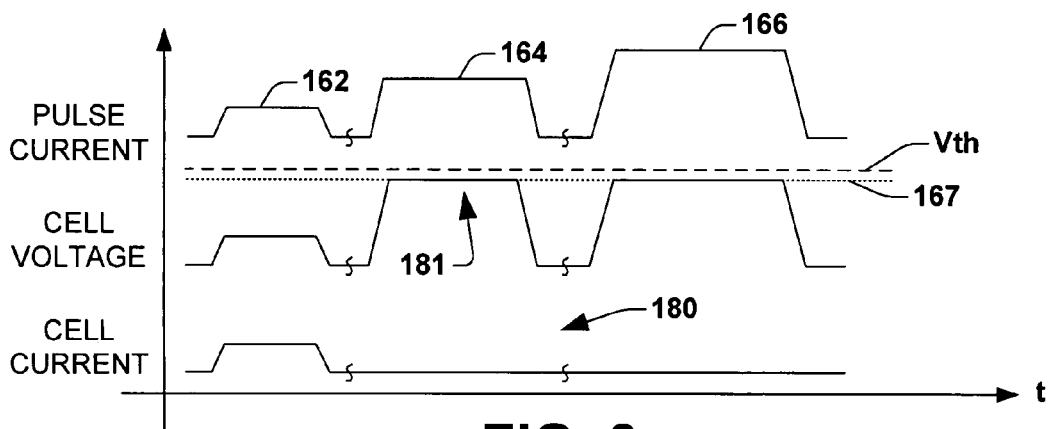

In accordance with another embodiment of the invention, in addition to each successive current pulse having a larger current magnitude, each successive current pulse also has a larger voltage magnitude, while each of the pulses are still below the intrinsic switching voltage threshold (Vth) of the phase change memory cell. An example of this methodology with different cases is illustrated in FIGS. 6-8.

Figure 6:
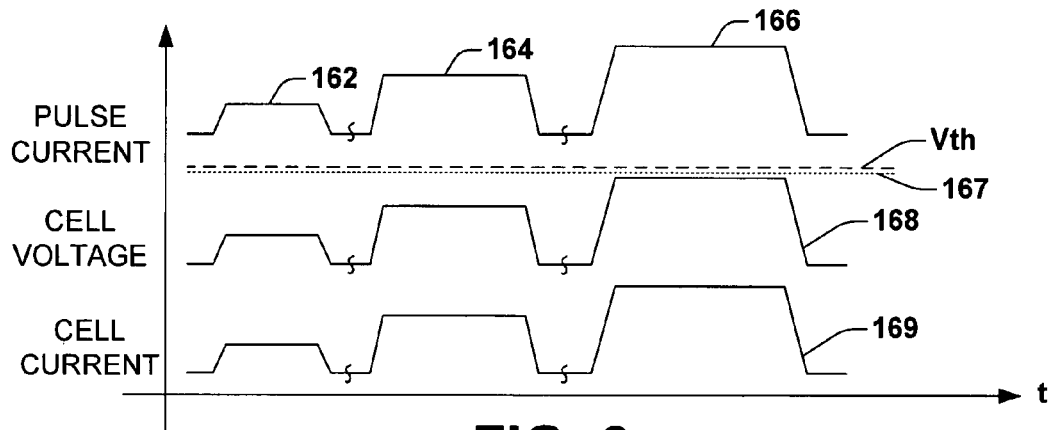
FIGS. 6-8 are graphs illustrating voltage and current waveforms associated with a memory cell during an addressing methodology that prevents overreset according to another embodiment of the invention.

FIG. 6 is a graph illustrating voltage and current waveforms in the case where the phase change memory cell does not RESET with a minimal RESET pulse. One example of a situation where this might occur is when the process variation in fabricating the phase change memory cell caused the critical dimension to be larger than a desired nominal value. The current density within the cell during RESET is therefore less than would normally be expected for a standard RESET pulse.

As can be seen in FIG. 6, the RESET operation involves the application of three current pulses 162, 164, 166, wherein each successive current pulse has a larger current amplitude than the respective previous pulse. In addition, in this particular case each successive pulse also has a larger voltage magnitude associated therewith as shown at 168, however, in another embodiment of the invention, the voltage magnitude may be kept constant. In either case, the voltage magnitude of the RESET pulses are limited to be less than the intrinsic switching voltage threshold identified at Vth in the graph. In FIG. 6, this voltage limit is shown at reference numeral 167. In one embodiment such voltage is limited by liming the bit line voltage to a predetermined value during the RESET operation. Note that in FIG. 6, the cell current 169 increased with each successive current pulse applied thereto, thereby indicating that the phase change memory cell had not been RESET upon application of either the first or second current pulses.

Referring to FIG. 7, again, each of the three successive current pulses exhibit an increasing current magnitude as well as an associated increasing voltage magnitude. In addition, each of the voltage magnitudes are maintained to be less than the intrinsic switching voltage threshold (Vth), as illustrated at reference numeral 167. In the example of FIG. 7, however, the phase change memory cell was RESET by the second current pulse 170. This can be verified by the cell current waveform, wherein during time 172 when the third current pulse 166 is applied at 174 to the memory cell, no substantial cell current conducts therethrough. That can be appreciated by evaluating the graph in FIG. 4. Since the memory cell was RESET with the second current pulse, the current through the memory cell during the third pulse obeys the current trace 154 in FIG. 4, where the voltage is less than Vth. In that case, the current through the RESET cell is negligible. Therefore the subsequent pulse 166 does not disturb the RESET cell.

At 175 it can be seen that the voltage magnitude associated with the third pulse is clamped at the level 167 that is less than Vth. This phenomena occurs because the cell in this example is RESET after the second pulse, thus causing the resistance of the phase change material to increase substantially. Forcing the next current pulse through the higher resistance material causes the cell voltage to increase substantially, however, the cell voltage is ultimately limited to the value at 167 by a voltage limit or clamp placed on the respective bit line associated with the cell. In the above manner, the cell voltage is maintained below the instrinsic switching voltage (Vth), thus preventing the third pulse from overrestting the memory cell.

Similarly, in FIG. 8 three consecutive or successive current pulses 162, 164, 166 are applied to the memory cell during a RESET operation, wherein each subsequent current pulse has a larger current magnitude than the previous pulse. As can be seen from the cell current portion of the graph, after the first current pulse is applied thereto, the memory cell has been RESET, and thus the subsequent application of current pulses do not result in any substantial conduction through the RESET cell, as evidenced by the cell current trace at 180. In this example, the phase change memory cell may have been slightly smaller in critical dimension than a nominal sized cell, and thus the current density therein was sufficient with the smaller magnitude current pulse to fully RESET the cell. Then, once the cell has been RESET, since the subsequent applied pulses have a voltage magnitude associated therewith that is less than the intrinsic switching voltage threshold (Vth), the subsequent pulses do not cause any substantial current conduction through the cell, and thus the subsequent pulses do not adversely affect the cell, and thus avoids an overreset condition.

Similar to FIG. 7, the cell voltage associated with the cell at 181 increased to the limit level 167 that is less than Vth. This voltage increase is due to the increased resistance of the phase change memory cell upon being RESET with the first current pulse. As highlighted above with respect to FIG. 7, the cell voltage is limited to a value 167 less than Vth by a limit or clamp circuit associated with the respective bit line during the RESET operation.

The example in FIG. 8 provides a good illustration of how the invention avoids an overreset of a phase change memory cell by providing a first relatively low magnitude current pulse 162, and then provides additional current pulse(s) of increasing magnitude that have a voltage level associated therewith less than Vth. In the above manner, the phase change memory cell is RESET with a current pulse that is commensurate with its critical dimension, and does not experience an overreset due to application of an unduly large current pulse. This is because if the cell is relatively small, it is sufficiently RESET by an earlier, lower current magnitude pulse, and the subsequent larger pulse(s) do not affect the RESET cell due to its voltage magnitude being less than the intrinsic switching voltage threshold (Vth) for the phase change memory cell.

While the above embodiment illustrated in FIGS. 6-8 show the voltage magnitude of the pulses incrementally increasing, alternative embodiments contemplate a constant voltage pulse magnitude or variations that differ from the embodiment above. In such alternative embodiments, however, the voltage magnitude of each of the pulses is less than the intrinsic switching voltage threshold (Vth) for the phase change memory cell being RESET.

Figure 9:
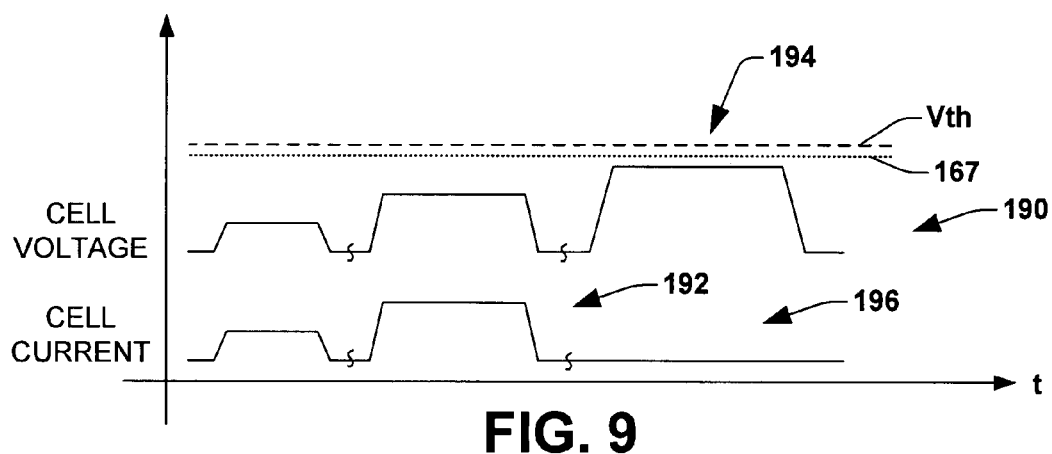
FIG. 9 is a graph illustrating voltage and current waveforms associated with a memory cell during an addressing methodology according to another embodiment of the invention.

According to another embodiment of the invention, a plurality of voltage pulses may be applied to a phase change memory cell, wherein each pulse may increase in voltage magnitude (for example, by varying the bit line voltage) while concurrently staying less than or equal to the level 167 to ensure the cell voltage remains less than the intrinsic switching voltage threshold (Vth) of the cell, as illustrated in FIG. 9. In FIG. 9, a plurality of voltage pulses 190 of successively increasing magnitude result in successively increasing cell currents 192. Depending on the critical dimension of the phase change memory cell, the first, second, or third pulse may be the pulse that serves to RESET the cell. In the embodiment illustrated in FIG. 9, the second pulse caused the phase change memory cell to become RESET; consequently, application of the third pulse 194 does not cause any appreciable cell current 196 because due to the nature of the RESET cell (FIG. 4) the third voltage pulse having a value less than Vth does not disturb or overreset the cell.

In another embodiment of the invention, a plurality of RESET pulses are successively applied to the phase change memory cell, wherein the first pulse is not voltage magnitude limited while subsequent pulses are limited in voltage to be less than Vth. Consequently, the first pulse is always heating up the phase change memory cell and either causing the cell to RESET or be partially SET. In the event that the first pulse operates to RESET the cell, the subsequent pulses will not disturb or overreset the cell. In those instances where the first pulse partially SETs the cell, the subsequent pulses will the RESET the cell completely. One advantage of this embodiment is that the RESET state is refreshed, which has advantages since the RESET state corresponds to the amorphous state of the phase change material, which is the metastable state. Consequently, the above embodiment is advantageous for high data retention applications, and in such instances the first pulse can be configured to purposefully be above Vth, and thus is configured to partially RESET the cell so that the RESET state can then be refreshed via the subsequent pulses that incrementally increase in current but have a voltage magnitude less than Vth.

Figure 10:
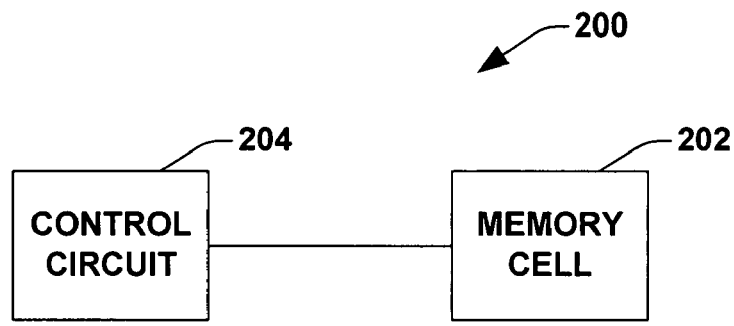
FIG. 10 is a block diagram illustrating a memory device according to an embodiment of the invention.

According to another embodiment of the invention, a memory device configured to prevent an overreset during an addressing of a memory cell is provided. Referring initially to FIG. 10, a memory 200 includes a memory cell 202 and a control circuit 204 operably associated therewith. In one embodiment of the invention, the memory cell 202 comprises a phase change memory element operable to be written to, thereby placing the element into one of the SET or RESET states. In one embodiment the control circuit 204 is configured to address the memory cell 202 by applying a plurality of pulses to the memory cell, wherein a subsequent pulse has an amplitude greater than an initial or earlier pulse.

In one embodiment, the pulses applied to the memory cell 202 by the control circuit 204 are current pulses configured to place the phase change memory element into the RESET state. With each of the current pulses having an incrementally larger current magnitude, the phase change memory element ends up being RESET by a current pulse that is commensurate with its critical dimension. That is, if the cell is relatively smaller than a nominal cell, a first pulse may effectuate a RESET, whereas if the cell is relatively larger than a nominal cell, a second or third pulse may be the pulse operative to effectuate the RESET state. Further, in another embodiment each current pulse has a voltage magnitude associated therewith (and thus applied to the phase change memory cell) that is less than the intrinsic switching voltage threshold (Vth) of the memory cell. Consequently, once the cell is RESET by the current pulse that is commensurate with the critical dimension thereof, for example, subsequent current pulses do not affect the programmed state of the cell, as illustrated in FIG. 4.

Figure 11:
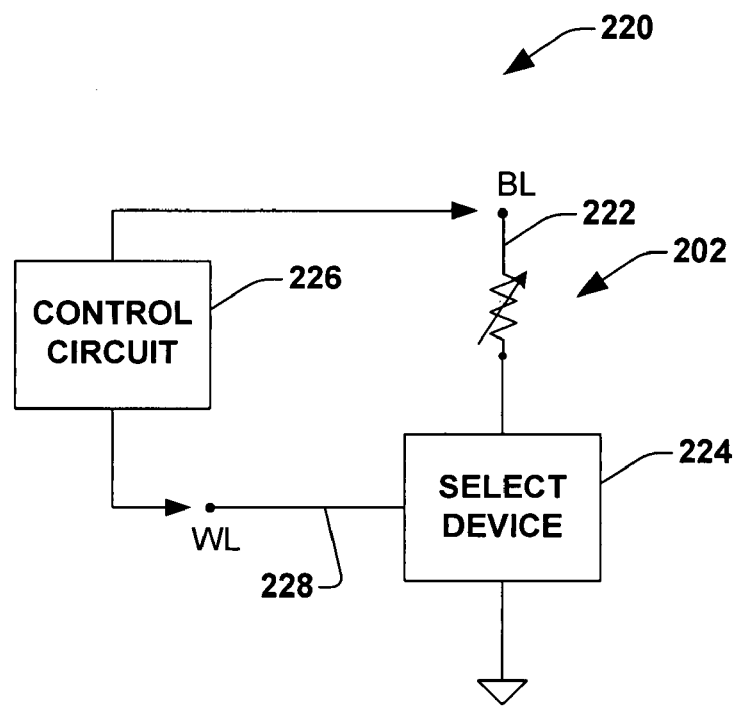
FIG. 11 is a block diagram illustrating a memory device according to still another embodiment of the invention.

In still another embodiment of the invention, a memory is provided in FIG. 11 at reference numeral 220. The memory 220 comprises a memory cell 202 such as a phase change memory element that is configured to be addressed and written thereto, for example, establishing one of a SET and RESET state. In the embodiment of FIG. 11, the memory element 202 is selectively operably coupled to a bit line (BL) 222 via a switching or select device 224. The memory 220 further comprises a control circuit 226 that is configured to provide various addressing signals. For example, in one embodiment, the control circuit 226 is configured to generate an addressing signal on a word line (WL) 228 that is operable to activate the select device 224, thereby operably coupling the phase change memory element 202 to the bit line 222.

Still referring to FIG. 11, the control circuit 226 is configured to coupled a voltage limited current source associated therewith to the bit line 222. The voltage limited current source in the control circuit 226 is then operable to provide a plurality of current pulses of successively increasing current magnitude to the memory element 202 to place the cell in a RESET condition when an instruction to perform such an operation is received. Further, the current source is voltage limited in one embodiment so that the voltage across the memory element 202 during the programming operation does not exceed the intrinsic switching voltage threshold (Vth) of the memory cell. Therefore once the cell 202 has been RESET, the application of further current pulses does not affect the RESET state of the cell.

In another embodiment of the invention, the control circuit 226 is configured to provide a bit line voltage to the bit line 222 that is less than Vth while concurrently providing control signals on the word line 228 to provide the successive current pulses to the cell 202. In this embodiment, the control circuit 226 provides signals on the word line 228 that operate to activate the select device 224 at a particular conduction level so as to use the select device to limit the first current pulse magnitude to a first current level, a second current pulse to a second current level, and a third current pulse (if employed) to a third, higher current level. In the above manner, the control device 226 uses the select device 224 as the current limit element to control the current levels of the successive current pulses. Further, the control device uses the select device 224 to dictate the timing of the pulses and their respective duration.

In accordance with another embodiment of the invention, a RESET operation can be performed in accordance with the principles highlighted above using a heater element. More particularly, as opposed to the phase change material being directly heated by the current pulse, the current may be employed to heat a heating element that is thermally local to the phase change material. For example, in one embodiment, a mushroom type phase change memory cell configuration may be employed, wherein between vertically spaced electrodes, both the phase change material and a heating element are interposed in a series type fashion. Alternatively, a heater element may be juxtaposed with respect to the phase change material in the memory cell in a parallel type configuration. In either case, the application of signals to the electrodes to generate current pulses with voltage magnitudes less than the intrinsic switching voltage threshold causes the heater to heat the phase change material and thus cause the phase change material to be RESET.

While the above embodiments have discussed a RESET method and associated device in conjunction with a binary state phase change memory cell, the present invention also contemplates the above RESET method for multi-level phase change cells. IN such multi-level memory cells, a cell has a SET state, a RESET state, and one or more intermediate states that may be considered either partially SET states or partially RESET states. In such embodiment, the above described method and device may be employed to fully RESET a multi-level phase change memory cell according to the same principles highlighted herein.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of addressing a memory cell, comprising:
    applying a plurality of distinct pulses to the memory cell, wherein the plurality of distinct pulses are separated from one another in the time domain such that the distinct pulses neither overlap one another nor abut one another, and wherein a subsequent pulse of the plurality of pulses has an amplitude greater than an initial pulse,
    wherein the memory cell comprise a phase change memory cell,
    wherein addressing the memory cell comprises performing a reset operation on the memory cell,
    wherein the pulses comprise current pulses, and
    wherein a voltage magnitude of each of the pulses is less than an intrinsic switching voltage threshold of the phase change memory cell.

2. The method of claim 1, wherein the phase change memory cell comprises a multi-level phase change memory cell.

3. The method of claim 1, wherein the memory cell further comprises a heater element associated therewith, and wherein the applied pulses cause the heater element to deliver heat to phase change material of the phase change memory cell.

4. A method of addressing a memory cell, comprising:
    applying a plurality of distinct pulses to the memory cell, wherein the plurality of distinct pulses are separated from one another in the time domain such that the distinct pulses neither overlap one another nor abut one another, and wherein a subsequent pulse of the plurality of pulses has an amplitude greater than an initial pulse, wherein the memory cell comprise a phase change memory cell, wherein addressing the memory cell comprises performing a reset operation on the memory cell, wherein the pulses comprise voltage pulses, and wherein each of the voltage pulses is less than an intrinsic switching voltage threshold of the phase change memory cell.

5. A method of addressing a phase change memory cell, comprising:

applying a plurality of distinct current pulses to the phase change memory cell during a reset operation, wherein the plurality of distinct current pulses are separated from one another in the time domain such that the distinct current pulses neither overlap one another nor abut one another, and wherein each subsequent current pulse has a current magnitude greater than a previous pulse.

6. The method of claim 5, wherein each of the current pulses has a voltage magnitude that is less than an intrinsic switching voltage threshold of the phase change memory cell.

7. The method of claim 5, wherein a first current pulse has a voltage magnitude greater than an intrinsic switching voltage threshold of the phase change memory cell, and wherein each of the subsequent current pulses have a voltage magnitude less than the intrinsic switching voltage threshold.

8. The method of claim 5, wherein the phase change memory element is coupled to a bit line during addressing, and wherein the current magnitude of the pulses is controlled with a controllable current source coupled thereto.

9. The method of claim 5, wherein the phase change memory element is coupled to a bit line during addressing via a select device, and wherein the current magnitude of the pulses is controlled by the select device.

10. The method of claim 5, wherein the phase change memory cell comprises a multi-level phase change memory cell.

11. The method of claim 5, wherein the phase change memory cell further comprises a heater element associated therewith, and wherein the applied pulses cause the heater element to deliver heat to phase change material of the phase change memory cell.

12. A method of performing a reset operation for a phase change memory element, comprising:

applying a first reset pulse having a first current magnitude to the phase change memory element; and applying a second reset pulse having a second current magnitude greater than the first current magnitude after applying the first reset pulse.

13. The method of claim 12, further comprising applying a third reset pulse having a third current magnitude greater than the second current magnitude after applying the second reset pulse.

14. The method of claim 13, wherein each of the first, second, and third current pulses have a voltage magnitude associated therewith that is less than an intrinsic switching voltage threshold of the phase change memory cell.

15. The method of claim 13, wherein the first current pulse has a voltage magnitude greater than an intrinsic switching voltage threshold of the phase change memory cell, and wherein each of the subsequent current pulses have a voltage magnitude less than the intrinsic switching voltage threshold.

16. The method of claim 12, wherein applying the first reset pulse comprises:

coupling the phase change memory element to a bit line; and coupling a controllable current source to the bit line, wherein the current source provides the first reset pulse.

17. The method of claim 12, wherein applying the first reset pulse comprises:

coupling the phase change element to a bit line having a voltage less than an intrinsic switching voltage threshold of the phase change memory element; and controlling the current of the first reset pulse to the first current magnitude via a select device that is configured to selectively couple the phase change memory element to the bit line.

18. The method of claim 12, wherein the phase change memory cell comprises a multi-level phase change memory cell.

19. The method of claim 12, wherein the phase change memory cell further comprises a heater element associated therewith, and wherein the applied pulses cause the heater element to deliver heat to phase change material of the phase change memory cell.

20. A method of addressing a phase change memory cell, comprising:

applying a plurality of current pulses to the phase change memory cell during a reset operation, wherein each subsequent current pulse has a current magnitude greater than a previous current pulse, and wherein a voltage associated with a first of the plurality of current pulses is not voltage limited and a voltage associated with each subsequent current pulse is voltage limited.

21. The method of claim 20, wherein the voltage of each subsequent current pulse is limited to a value less than an intrinsic switching voltage threshold of the phase change memory cell.

22. The method of claim 20, wherein a magnitude of a voltage of each subsequent current pulse is greater than a previous pulse.

* * * * *